US007649141B2

(12) United States Patent
Schmit et al.

(10) Patent No.: US 7,649,141 B2
(45) Date of Patent: Jan. 19, 2010

(54) EMITTER WRAP-THROUGH BACK CONTACT SOLAR CELLS ON THIN SILICON WAFERS

(75) Inventors: Russell R. Schmit, Sandia Park, NM (US); James M. Gee, Albuquerque, NM (US)

(73) Assignee: Advent Solar, Inc., Albuquerque, NM (US)

( * ) Notice: Subject to any disclaimer, the term of this patent is extended or adjusted under 35 U.S.C. 154(b) by 834 days.

(21) Appl. No.: 10/880,190

(22) Filed: Jun. 29, 2004

(65) Prior Publication Data

US 2004/0261840 A1    Dec. 30, 2004

Related U.S. Application Data

(60) Provisional application No. 60/484,122, filed on Jun. 30, 2003.

(51) Int. Cl.
*H01L 31/00* (2006.01)
*H02N 6/00* (2006.01)
(52) U.S. Cl. ...................... 136/261; 136/243
(58) Field of Classification Search ............. 136/249, 136/255; 437/2
See application file for complete search history.

(56) References Cited

U.S. PATENT DOCUMENTS

| | | |
|---|---|---|
| 3,903,427 A | 9/1975 | Pack |
| 3,903,428 A | 9/1975 | DeJong |
| 3,936,319 A | 2/1976 | Anthony et al. |
| 4,032,960 A | 6/1977 | Anthony et al. |

(Continued)

FOREIGN PATENT DOCUMENTS

EP    0452588 A1    10/1991

(Continued)

OTHER PUBLICATIONS

Smith et al. ("Circuit Modeling of the Emitter-Wrap-Through Solar Cell", IEEE, Electron Devices, vol. 46, No. 10, Oct. 1999, pp. 1993-1998).*

(Continued)

*Primary Examiner*—Alexa D Neckel
*Assistant Examiner*—Miriam Berdichevsky
(74) *Attorney, Agent, or Firm*—Stephen A. Slusher; Philip D. Askenazy; Peacock Myers, P.C.

(57) ABSTRACT

A thin emitter wrap-through solar cell and method for making a thin emitter wrap-through solar cell. The cell preferably includes a silicon wafer substrate having a thickness of less than 280 microns. The p-type area on the back side of the cell is minimized, which maximizes the collector area and reduces or eliminates stress due to passivation of the p-type area, which is required for conventional solar cells. The efficiency of the cell of the present invention peaks for a much smaller thickness than that for conventional cells. Thus thin wafers of inexpensive, lower quality silicon may be used without a significant efficiency penalty, providing a large cost advantage over other solar cell configurations. Vias through the substrate, which connect emitter layers on the front and back surfaces of the substrate, may consist of holes which are doped, or alternatively may be solid doped channels formed by migration of a solvent, which preferably contains a dopant, caused by a gradient-driven process.

53 Claims, 2 Drawing Sheets

U.S. PATENT DOCUMENTS

| | | | |
|---|---|---|---|
| 4,056,879 A | 11/1977 | Lindmayer | |
| 4,065,742 A | 12/1977 | Kendall et al. | |
| 4,152,824 A | 5/1979 | Gonsiorawski | |
| 4,165,558 A | 8/1979 | Armitage et al. | |
| 4,173,496 A | 11/1979 | Chiang et al. | |
| 4,184,897 A | 1/1980 | Anthony et al. | |
| 4,190,852 A | 2/1980 | Warner, Jr. | |
| 4,227,942 A | 10/1980 | Hall | |
| 4,234,352 A | 11/1980 | Swanson | |
| 4,297,391 A | 10/1981 | Lindmayer | |
| 4,427,839 A * | 1/1984 | Hall | 136/255 |
| 4,478,879 A | 10/1984 | Baraona et al. | |
| 4,536,607 A | 8/1985 | Wiesmann | |
| 4,595,790 A | 6/1986 | Basol | |
| 4,626,613 A | 12/1986 | Wenham et al. | |
| 4,663,828 A | 5/1987 | Hanak | |
| 4,664,829 A | 5/1987 | Arakawa et al. | |
| 4,667,058 A | 5/1987 | Catalano et al. | |
| 4,667,060 A | 5/1987 | Spitzer | |
| 4,726,850 A | 2/1988 | Wenham et al. | |
| 4,748,130 A | 5/1988 | Wenham et al. | |
| 4,751,191 A | 6/1988 | Gonsiorawski et al. | |
| 4,838,952 A | 6/1989 | Dill et al. | |
| 4,927,770 A | 5/1990 | Swanson | |
| 5,011,565 A | 4/1991 | Dube et al. | |
| 5,011,782 A | 4/1991 | Lamb et al. | |
| 5,053,083 A | 10/1991 | Sinton | |
| 5,053,355 A | 10/1991 | von Campe | |
| 5,067,985 A | 11/1991 | Carver et al. | |
| 5,103,268 A | 4/1992 | Yin et al. | |
| 5,118,362 A | 6/1992 | St. Angelo et al. | |
| 5,178,685 A | 1/1993 | Borenstein et al. | |
| 5,266,126 A | 11/1993 | Deguchi | |
| 5,273,934 A | 12/1993 | Ehinger et al. | |
| 5,425,816 A | 6/1995 | Cavicchi et al. | |
| 5,468,652 A * | 11/1995 | Gee | 438/98 |
| 5,494,832 A | 2/1996 | Lehmann et al. | |
| 5,547,516 A | 8/1996 | Luch | |
| 5,585,165 A | 12/1996 | Kennedy et al. | |
| 5,593,901 A | 1/1997 | Oswald et al. | |
| 5,595,607 A | 1/1997 | Wenham et al. | |
| 5,641,362 A | 6/1997 | Meier | |
| 5,646,397 A | 7/1997 | Wenham et al. | |
| 5,797,998 A | 8/1998 | Wenham et al. | |
| 5,851,912 A | 12/1998 | Liaw et al. | |
| 5,871,591 A | 2/1999 | Ruby et al. | |
| 5,899,704 A | 5/1999 | Schlosser et al. | |
| 5,928,438 A | 7/1999 | Salami et al. | |
| 5,942,050 A | 8/1999 | Green et al. | |
| 5,951,786 A | 9/1999 | Gee et al. | |
| 5,972,732 A | 10/1999 | Gee et al. | |
| 5,981,868 A | 11/1999 | Kushiya et al. | |
| 5,990,415 A | 11/1999 | Green et al. | |
| 6,048,442 A | 4/2000 | Kushiya et al. | |
| 6,069,313 A | 5/2000 | Kay | |
| 6,081,017 A | 6/2000 | Kim et al. | |
| 6,091,021 A | 7/2000 | Ruby et al. | |
| 6,092,669 A | 7/2000 | Kushiya et al. | |
| 6,143,976 A * | 11/2000 | Endros | 136/256 |
| 6,162,658 A | 12/2000 | Green et al. | |
| 6,175,141 B1 | 1/2001 | Hofbauer et al. | |
| 6,180,869 B1 | 1/2001 | Meier et al. | |
| 6,184,056 B1 | 2/2001 | Nakamura et al. | |
| 6,184,057 B1 | 2/2001 | Van Andel et al. | |
| 6,210,991 B1 | 4/2001 | Wenham et al. | |
| 6,262,359 B1 | 7/2001 | Meier et al. | |
| 6,384,316 B1 | 5/2002 | Sinohara et al. | |
| 6,384,317 B1 | 5/2002 | Van Kerschaver et al. | |
| 6,420,647 B1 | 7/2002 | Ji et al. | |
| 6,429,037 B2 | 8/2002 | Wenham et al. | |
| 6,441,297 B1 | 8/2002 | Keller et al. | |
| 6,538,195 B1 | 3/2003 | Shi et al. | |
| 6,559,479 B1 * | 5/2003 | Ludemann | 257/99 |
| 6,559,497 B2 | 5/2003 | Shih et al. | |
| 6,613,653 B2 | 9/2003 | Naseem et al. | |
| 6,632,730 B1 | 10/2003 | Meier et al. | |
| 6,664,631 B2 | 12/2003 | Meier et al. | |
| 6,703,295 B2 | 3/2004 | Meier et al. | |
| 6,734,037 B1 | 5/2004 | Fath et al. | |
| 6,737,340 B2 | 5/2004 | Meier et al. | |
| 6,777,729 B1 | 8/2004 | Prince et al. | |
| 6,846,984 B2 | 1/2005 | Fath et al. | |
| 2002/0011641 A1 | 1/2002 | Oswald et al. | |
| 2002/0117199 A1 | 8/2002 | Oswald | |
| 2002/0119592 A1 | 8/2002 | Oswald et al. | |
| 2003/0003693 A1 | 1/2003 | Meier et al. | |
| 2003/0008485 A1 | 1/2003 | Meier et al. | |
| 2003/0037815 A1 | 2/2003 | Kim et al. | |
| 2003/0044539 A1 | 3/2003 | Oswald | |
| 2003/0089393 A1 | 5/2003 | Fath et al. | |
| 2003/0102022 A1 | 6/2003 | Fath et al. | |
| 2003/0116185 A1 | 6/2003 | Oswald | |
| 2003/0143827 A1 | 7/2003 | Wenham et al. | |
| 2003/0180983 A1 | 9/2003 | Oswald et al. | |
| 2003/0203603 A1 | 10/2003 | Meier et al. | |
| 2004/0187916 A1 | 9/2004 | Hezel | |
| 2004/0200520 A1 | 10/2004 | Mulligan et al. | |
| 2004/0219801 A1 | 11/2004 | Oswald et al. | |
| 2004/0261839 A1 | 12/2004 | Gee et al. | |
| 2004/0261840 A1 | 12/2004 | Schmit et al. | |
| 2005/0115604 A1 | 6/2005 | Fath et al. | |

FOREIGN PATENT DOCUMENTS

| | | |
|---|---|---|
| JP | 60000783 | 1/1985 |
| JP | 63202378 | 2/1990 |
| WO | WO89/04062 | 5/1989 |
| WO | WO 93/24960 | 12/1993 |
| WO | WO02/25743 A2 | 3/2002 |
| WO | WO 2004/100244 A1 | 11/2004 |

OTHER PUBLICATIONS

Brucker et al. (Handbook of Magneto-Optical Data Recording—Materials, Subsystems, Techniques, © 1997 William Andrew Publishing/Noyes, pp. 284-285).*

Duerinckx, F., et al., "Improved Screen Printing Process for Very Thin Multicrystalline Silicon Solar Cells", *presented at the 19th EPVSEC*, Paris, (2004).

Eikelboom, D.W.K., et al., "Conductive Adhesives for Interconnection of Busbarless Emitter Wrap-Through Solar Cells on a Structured Metal Foil", *presented at the 17th European Photovoltaic Solar Energy Conference*, Munich, Germany, Oct. 22-26, 2001.

Gee, James M., et al., "Simplified Module Assembly Using Back-Contact Crystalline-Silicon Solar Cells", *presented at the 26th IEEE Photovoltaic Specialists Conference*, Sep. 29-Oct. 3, 1997, Anaheim, California, (Sep. 1997).

Schneider, A., et al., "AL BSF for Thin Screenprinted Multicrystalline SI Solar Cells", *presented at the 17th Eur. PV Solar Energy Conf.*, Munich, (Oct. 2001).

Schneider, A., et al., "Bow Reducing Factors for Thin Screenprinted MC-SI Solar Cells with AL BSF", *presented at the 29th IEEE Photovolatic Specialists Conference*, New Orleans, LA, (336), 2002.

Schoenecker, A., et al., "Ace Designs: The Beauty of Rear Contact Solar Cells", *Presented at the 29th IEEE Photovoltaic Specialists Conference*, May 20-24, 2002, New Orleans, USA, (May 2002).

Tool, C.J.J., et al., "Effect of Wafer Thickness on the Performance of mc-Si Solar Cells", *presented at the 17th European Photovoltaic Solar Energy Conference*, Munich, (2001).

Dicker, J., et al., "Analysis of rear contacted solar cell structures for cost effective processes and materials", *Photovoltaic Specialists Conference, 2000, Conference Record of the Twenty-Eighth IEEE*, Anchorage, Alaska, (Sep. 15-22, 2000),387-390.

Gee, James M., et al., "Back-Contact Crystalline-Silicon Solar Cells and Modules", *NCPV Program Review Meeting*, (Sep. 8-11, 1998),1-6.

Gee,.J. M., et al., "Emitter wrap-through solar cell", *Photovoltaic Specialists Conference 1993, Conference Record of the Twenty Third IEEE*, Louisville, Kentucky,(May 10-14, 1993),265-270.

Gee, James M., et al., "Progress on the Emitter Wrap-Through Silicon Solar Cell", *12th European Photovoltaic Solar Energy Conference*, Amsterdam,(Apr. 1994).

Gee, James M., et al., "Simplified Module Assembly Using Back-Contact Crystalline-Silicon Solar Cells", *26th IEEE Photovoltaic Specialists Conference*, (1998), 1085-1088.

Gee, James M., et al., "Towards a Manufacturable Back-Contact Emitter-Wrap-Through Silicon Solar Cell", *31st IEEE Photovoltaic Specialists Conference*, Orlando, Florida, (Jan. 2005),3-7.

Hacke, Peter, et al., "Application of Boron Source Diffusion Barrier for the Fabrication of Back Cotnact Silicon Solar Cells", *31st IEEE Photovoltaic Specialists Conference*, Orlando, Florida,(Jan. 2005),3-7.

Hacke, Peter, et al., "Poster for 'Application of a Boron Source Diffusion Barrier for the Fabrication of Back Contact Silicon Solar Cells'", *31st IEEE Photovoltaic Specialist Conference*, Orlando, Florida, (Jan. 2005),3-7.

Hilali, M., et al., "Optimization of Self-Doping Ag Paste Firing to Achieve High Fill Factors on Screen-Printed Silicon Solar Cells with a 100 ohm/sq. Emitter", *29th IEEE Photovoltaic Specialists Conference*, New Orleans, Louisiana,(May 2002),356-359.

Meier, D.L., et al., "Self-Doping Contacts to Silicon Using Silver Coated with a Dopant Source", *28th IEEE Photovoltaic Specialists Conference*, (2000),69-74.

Neu, W., et al., "Low-cost multicrystalline back-contact silicon solar cells with screen printed metallization", *Elsevier Solar Energy Materials & Solar Cells*, (2002), 139-146.

Pritchard, Stephen C., "A Comparison of Single Junction and Transistor Structure Solar Cells", *Proceedings of Solar '97, Paper 112*, Australian and New Zealand Solar Energy Society,(1997).

Schoenecker, A., et al., "Ace Designs: The Beauty of Rear Contact Solar Cells", *29th IEEE Photovoltaic Specialsists Conference*, New Orleans, USA,(May 20-24, 2002).

Schoenecker, A., et al., "Advanced Crystalline Silicon Solar Cell Designs (ACE)", *Final Report of European Commission project*, JOR3-CT98-0269.

Schoenecker, A., et al., "An Industrial Multi-Crystalline EWT Solar Cell with Screen Printed Metallisation", *14th Eur. Photovoltaic Solar Energy Conference and Exhibition*, Barcelona, Spain,(1997).

Smith, David D., et al., "Circuit Modeling of the Emitter-Wrap-Through Solar Cell", *IEEE Transactions on Electron Devices*, vol. 46, No. 10,(Oct. 1999).

Smith, D., "Emitter-Wrap Through Solar Cells With Screen-Printed Contacts", *NCPV Program Review Meeting 2000*, NREL Report No. BK-520-28064,(Apr. 16-19, 2000),307.

Smith, David D., et al., "Review of Back Contact Silicon Solar Cells for Low Cost Application", *16th Eur. Photovoltaic Solar Energy Conference and Exhibition*, Glasgow, United Kingdom,(1999).

Tool, C.J.J., et al., "Effect of Water Thickness on the Performance of mc-Si Solar Cells", *17th European Photovoltaic Solar Energy Conference*, Munich, Germany,(2001),paper VC1/40.

Verlinden, P., et al., "Multilevel Metallization for Large Area Point-Contact Solar Cells", *IEEE*, (1988),532-537.

Book, Felix et al., "Two Diffusion Step Selective Emitter: Comparison of Mask Opening by Laser or Etching Paste", *23rd European Photovoltaic Solar Energy Conference and Exhibition*, Valencia, Spain, Sep. 5, 2008.

Hacke, P. et al., "Efficiency Optimization of the n+/n/p+ 'PHOSTOP' Cell", *19th European Photovoltaic Solar Energy Conference* Paris, France Jun. 7, 2004 , 1292-1295.

Haverkamp, Helge et al., "Minimizing the Electrical Losses on the Front Side: Development of a Selective Emitter Process from a Single Diffusion", *33rd IEEE Photovoltaic Specialists Conference*, San Diego, CA. May 15, 2008.

Jooss, W. et al., "Large Area Multicrystalline Silicon Buried Contact Solar Cells with Bulk Passivation", May, 2002.

Knauss, H. et al., "Emitter Wrap Through Solar Cells Using Electroless Plating Metallisation", 2001.

Pernau, Thomas et al., "Summary of the BMWI-UKN Project on Innovative and Cost-Effective Crystalloine Silicon Solar Cells with New Applications", Sep. 2005.

Peter, K. et al., "Future Potential for SOG-SI Feedstock from the Metallurgical Process Route", *23rd EU-PVSEC* Valencia, Spain, Sep. 1-5, 2008.

\* cited by examiner

EMITTER WRAP-THROUGH BACK CONTACT SOLAR CELLS ON THIN SILICON WAFERS

CROSS-REFERENCE TO RELATED APPLICATION

This application claims the benefit of the filing of U.S. Provisional Patent Application Ser. No. 60/484,122, entitled "Emitter Wrap-Through Back Contact Solar Cells on Thin Silicon Wafers", filed on Jun. 30, 2003, and the specification thereof is incorporated herein by reference.

BACKGROUND OF THE INVENTION

1. Field of the Invention (Technical Field)

The present invention relates to photovoltaic solar cells for the generation of electrical power directly from light, whether natural sunlight or artificial light, and more particularly, to thin crystalline substrate solar cells employing emitter wrap-through (EWT) means wherein a conductive channel is formed through the silicon wafer in order to electrically contact an emitter on the front surface by wrapping the emitter through the thin crystalline substrate.

2. Background Art

Photovoltaic solar cells in use today typically are based on either crystalline silicon technology or on one of a variety of thin film technologies, such as amorphous silicon, copper indium diselenide, or cadmium telluride. Crystalline silicon has certain advantages over the thin films. The primary advantages of crystalline silicon include energy conversion efficiency, which is higher, and the durability and reliability when used out of doors. Thin films suffer from lower energy conversion efficiency, especially when fabricated on a commercially viable scale, and from degradation in performance when used out of doors for an extended period of time. Due to these fundamental problems, crystalline silicon is used in over 85% of the outdoor applications.

The current state-of-the-art in the photovoltaics industry is a solar cell fabricated on a thick, greater than 300 microns, crystalline silicon wafer. The wafer can be single crystal or multicrystalline. The solar cell design in widespread use today has a p/n junction formed near the front surface (that surface which receives the light) which creates an electron flow as light energy is absorbed in the cell. The conventional cell design has one set of electrical contacts on the front side of the cell, and a second set of electrical contacts on the back side of the solar cell. In a typical photovoltaic module these individual solar cells are interconnected electrically in series to increase the voltage. This interconnection is typically accomplished by soldering a conductive ribbon from the front side of one solar cell to the back side of an adjacent solar cell.

The current invention makes use of a different cell design called an Emitter Wrap-Through EWT) solar cell. The EWT cell is one approach in a family of designs called back-contact cells, all of which have both sets of electrical contacts on the back of the cell. These approaches are well documented, and include not only EWT but also Metal Wrap Through (MWT), Metal Wrap Around (MWA), and back junction designs. The unique feature of EWT cells, in comparison to MWT and MWA cells, is that there is no metal coverage on the front side of the cell, which means that none of the light impinging on the cell is blocked. The unique feature of the EWT cell in comparison to back junction solar cells is that an EWT cell maintains a current collection junction on the front surface, which is advantageous for high current collection efficiency. These advantages, in turn, lead to increased electrical output.

The EWT cell is disclosed in U.S. Pat. No. 5,468,652, Method Of Making A Back Contacted Solar Cell, to James M. Gee, incorporated here in full. The various back contact cell designs have also been discussed in numerous technical publications. However, all previous MWT, MWA, and EWT back contact cell designs have employed silicon wafers of standard thickness, above about 300 microns, while back junction cells require the use of expensive silicon materials with exceptionally long lifetimes.

In addition to U.S. Pat. No. 5,468,652, two other U.S. patents on which Gee is a co-inventor disclose methods of module assembly and lamination using back-contact solar cells, U.S. Pat. No. 5,951,786, Laminated Photovoltaic Modules Using Back-Contact Solar Cells, and U.S. Pat. No. 5,972,732, Method of Monolithic Module Assembly. Both patents disclose methods and aspects that may be employed with the invention disclosed herein, and are incorporated by reference as if set forth in full. U.S. Pat. No. 6,384,316, Solar Cell and Process of Manufacturing the Same, discloses an alternative back-contact cell design, but employing MWT, wherein the holes or vias are spaced comparatively far apart, with metal contacts on the front surface to help conduct current to the back surface, and further in which the holes are lined with metal.

Conventional crystalline silicon solar cells with contacts on both the front and back surfaces have disadvantages. A thick silicon wafer is required in order to provide the necessary strength for the manufacturing processes and resultant stresses. As wafers are made thinner, they are unable to accommodate the strain due to the coefficient of thermal expansion mismatch between the wafer and the back surface field (BSF), typically comprising an aluminum alloy on the back surface of the wafer. The purpose of the BSF is to reduce recombination losses ("passivation") at the back surface of standard configuration solar cells. The Al must be thick (typically greater than 30 μm) and have full-area coverage in order to achieve the desired electrical performance. However, the thermal expansion coefficient of Al is over 10× larger than that of Si. The resultant stress causes bowing of the cell, which can rise exponentially as the wafer thickness decreases, dramatically reduces manufacturing yields. Alternative passivation techniques to using a thick Al layer, such as reducing the Al thickness or firing temperature, using a thin-film evaporated metallization, using various dielectric layers (for example, thermally grown silicon dioxide or deposited layers of silicon dioxide, silicon nitride, etc.), using semiconductor heterojunctions (such as amorphous silicon or polysilicon), or using a boron doped silicon layer rather than the Al alloyed BSF, have not equaled the passivation of the Al layer and/or are expensive and difficult to perform, thus detracting from the cost savings obtained by using a thin wafer. These disadvantages are disclosed in, for example, A. Schneider et al., "Al BSF For Thin Screenprinted Multicrystalline Si Solar Cells", presented at the $17^{th}$ Eur. PV Solar Energy Conf., Munich, October 2001; A. Schneider et al., "Bow Reducing Factors For Thin Screenprinted Mc-Si Solar Cells With Al BSF", presented at the $29^{th}$ IEEE Photovoltaic Specialists Conference, New Orleans, La., May 2003 (p. 336), and F. Duerinckx et al., "Improved Screen Printing Process For Very Thin Multicrystalline Silicon Solar Cells", Presented at the 19th EPVSEC, 2004, Paris.

Typically the thickness of silicon wafer solar cells, whether back-contact or not, is over 300 microns. The amount of silicon required is a significant proportion of the cost of a conventional solar cell, and is a barrier to dramatic cost reduction required for more widespread use of photovoltaic power generation. Although thin films have the theoretical advantage of reducing the amount of raw material required, as the thickness of the semi-conducting layers is typically on the order of 1-5 microns, they have not been able to overcome the problems of low efficiency, poor reliability and environmental degradation. An alternative cell structure described in U.S. Pat. No. 6,143,976, Solar Cell with Reduced Shading and Method of Producing the Same, comprises a "tricrystal" wafer design, which because of the particular design and orientation of internal crystal angles, may be sawed comparatively thin. However, the disclosure is limited to the particularly tricrystal wafer design, and requires specialized etching methods and protocols. By requiring a specific crystalline orientation, the grid structure that must be used is convoluted and requires significant passivation of the back surface. It is further disclosed that a back surface recombination velocity of <100 cm/s, is required, which is very difficult if not impossible to achieve.

There is thus a need in the industry for solar cell designs which employ a thin crystalline wafer, such that the wafer is less than 300 microns in thickness, and preferably significantly less than 300 microns in thickness.

BRIEF SUMMARY OF THE INVENTION

The present invention overcomes the prior art limitations on the thickness of the crystalline wafer, yet maintains all of the advantages of the use of silicon. In a preferred embodiment, an EWT photovoltaic cell is provided wherein the crystalline silicon wafer has a thickness less than about 300 microns, preferably less than about 200 microns, more preferably less than about 100 microns, and most preferably less than about 60 microns. The energy conversion efficiency is higher with the EWT cell structure utilizing the thinner crystalline silicon wafers provided herein because there is no shadowing of the incoming light by electrical contacts on the front side. The light has a completely unobstructed path into the solar cell. In addition, the energy conversion efficiency is higher with the EWT cell structure on thin wafers because there is some electrical current generation at the back surface as well as the front surface. Thus the amount of raw material per cell is significantly reduced and the energy conversion efficiency is increased.

The invention thus provides a photovoltaic or solar cell that solves specific problems with the current state-of-the-art in the photovoltaic industry, namely, use of thick crystalline silicon wafers. The invention allows the use of very thin crystalline silicon wafers, which results in very high performance at a much reduced cost. It also significantly simplifies the assembly of the solar cells into a finished package.

The present invention further provides methods to fabricate EWT cells on thin (as described herein) crystalline wafers. The process for fabricating the EWT cells is chosen and designed such that the light will not pass through the wafer, even at very low thicknesses, but without any requirement for an aluminum back layer as found in a conventional solar cell. The application of the EWT on thin wafers reduces the raw material consumption, and therefore cost, and also increases performance in comparison to conventional solar cells. This higher performance is a direct result of the synergistic combination of thin wafers and an EWT design. In this way, the solar cell can have high performance and lower cost due to the lower wafer thickness without the stress and breakage problem associated with the aluminum back layer.

An added benefit of this approach is that one of the disadvantages of the EWT approach is also solved by the use of thin wafers. EWT cells have numerous holes in the wafer (see FIG. 1) which are typically drilled with a laser, or have passages formed by other methods, including but not limited to gradient-driven methods such as thermomigration and electromigration. The time to perform this process has been a barrier to the implementation of the EWT cells on standard wafers. By using thin wafers the processing time is reduced.

The present invention is an emitter wrap-through (EWT) solar cell comprising a silicon wafer substrate having a thickness less than approximately 280 microns, wherein the substrate is multicrystalline or, including but not limited to if the substrate comprises a single crystal, has a crystal orientation other than (110). The substrate preferably comprises p-doped silicon and has a thickness of preferably less than approximately 200 microns, more preferably less than approximately 100 microns, even more preferably less than approximately 60 microns, and most preferably less than approximately 20 microns. The cell preferably comprises at least one base contact region disposed on a back surface of the cell. The base contact region preferably comprises less than approximately 50%, more preferably less than approximately 40%, even more preferably less than approximately 25%, yet more preferably less than approximately 10%, and most preferably less than approximately 5%, of the surface area of the back surface. The base contact region optionally provides little or no passivation, and optionally comprises a higher optical reflectance than aluminum, preferably increasing the optical absorption of the substrate. The base contact region preferably comprises silver or alternatively nickel. The base contact region preferably comprises a $p^+$ layer that passes through an $n^+$ emitter region disposed on the back surface in order to contact the substrate.

The substrate used in the solar cell of the present invention optionally comprises a diffusion length of less than approximately 300 microns, more preferably less than approximately 200 microns, and most preferably less than approximately 108 microns. The substrate is optionally heavily doped with a p-type acceptor, preferably comprising boron. A cell with this type of substrate preferably comprises an efficiency of greater than about 15%, more preferably greater than about 17%. The substrate preferably has a thickness of less than or equal to approximately half the diffusion length, and preferably has a textured front surface.

The solar cell of the present invention comprises vias connecting a front surface of the substrate to a back surface of the substrate which are preferably formed by a process comprising an operation selected from the group consisting of laser drilling, dry etching, wet etching, mechanical drilling, and water jet machining, preferably followed with a diffusion of a dopant into the walls of the holes to make a conductive via. Alternatively the vias comprise a substantially solid cross section and comprise doped substrate material, and preferably are formed by a gradient-driven process, preferably thermomigration. The diameter of the via is optionally approximately greater than or equal to a thickness of the substrate.

The base contact region is preferably formed by diffusion of a p-type acceptor, preferably boron, from a diffusion barrier into the substrate. The diffusion barrier preferably comprises a dielectric material applied as a paste, or alternatively a dielectric material deposited by chemical vapor deposition and subsequent patterning.

The present invention is alternatively an EWT solar cell comprising a silicon wafer substrate having a thickness less than approximately 280 microns and a back surface, wherein the back surface recombination velocity is greater than approximately 100 cm/s for the base contact region.

The present invention is also a solar cell, preferably an EWT solar cell, comprising a semiconductor wafer substrate having a thickness of less than approximately 280 microns, wherein the substrate has a diffusion length of less than approximately 300 microns, and wherein the solar cell has an efficiency of greater than approximately 15%, more preferably greater than approximately 17%.

The present invention is a method for making a solar cell, the method comprising the steps of: providing a p-doped silicon substrate having a thickness of less than approximately 280 microns; disposing an $n^+$ emitter layer on a majority of a front surface and back surface of the substrate; connecting the $n^+$ emitter layer on the front surface to the $n^+$ emitter layer on the back surface; and disposing one or more base contact regions on portions of the back surface. The substrate has a thickness of preferably less than approximately 200 microns, more preferably less than approximately 100 microns, even more preferably less than approximately 60 microns, and most preferably less than approximately 20 microns. The base contact regions preferably comprise less than approximately 50%, more preferably less than approximately 40%, even more preferably less than approximately 25%, yet more preferably less than approximately 10%, and most preferably less than approximately 5%, of the surface area of the back surface. The step of disposing one or more base contact regions preferably comprises increasing optical absorption of the substrate. The base contact regions preferably comprise silver or alternatively nickel. The step of disposing one or more base contact regions preferably comprises passing the base contact regions through the $n^+$ emitter layer disposed on the back surface, preferably comprising a process selected from the group consisting of laser drilling, etching, aluminum alloying, boron diffusion, thermomigration, electromigration, and/or a gradient-driven process.

The substrate used in the present method optionally comprises a diffusion length of less than approximately 300 microns, more preferably less than approximately 200 microns, and most preferably less than approximately 108 microns. The substrate is optionally heavily doped with a p-type acceptor, preferably comprising boron. A cell with this type of substrate preferably comprises an efficiency of greater than about 15%, more preferably greater than about 17%. The substrate preferably has a thickness of less than or equal to approximately half the diffusion length. The method preferably comprises the step of texturing the front surface.

The connecting step preferably comprises extending one or more vias through the substrate, preferably comprising using a process selected from the group consisting of laser drilling, dry etching, wet etching, mechanical drilling, and water jet machining. The vias preferably comprise a substantially solid cross section and comprise substrate material, wherein extending one or more vias comprises using a gradient-driven process, preferably thermomigration. This process preferably comprises the steps of: disposing material comprising a solvent on the front surface and migrating the solvent or material through the substrate to the back surface. The feature size, including but not limited to the diameter, length, width, or thickness, of each of the vias is optionally approximately the same as the thickness of the substrate.

The step of disposing one or more base contact regions optionally comprises the steps of: depositing a diffusion barrier that contains a p-type acceptor, preferably comprising boron, on desired areas of the back surface; diffusing the p-type acceptor contained in the diffusion barrier into the substrate.

The invention is also a solar cell made according to the above method.

A primary object of the present invention is to provide an EWT cell employing a thin crystalline silicon substrate, with a thickness less than about 280 microns, preferably less than about 200 microns, more preferably less than about 100 microns, and most preferably less than about 60 microns.

Another object of the present invention is to provide an increased efficiency EWT cell by means of use of a thin crystalline silicon substrate.

Still another object of the invention is to provide thin wafer solar cells which do not bow due to thermal stresses.

Yet another object of the invention is to provide methods of manufacturing EWT cells with a thin crystalline silicon substrate, including improved methods for making holes or vias, such methods being implemented, in part, by the thinness of the silicon substrate.

A primary advantage of the present invention is that it reduces the silicon wafer use and accordingly reduces the cost of the device.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

It has been unexpectedly and surprisingly discovered that very thin crystalline silicon wafers, with a thickness less than about 280 microns, preferably less than about 200 microns, more preferably less than about 100 microns, even more preferably less than about 60 microns, and most preferably less than about 20 microns, can be employed in an EWT photovoltaic cell. Heretofore, the thickness of a crystalline silicon wafer was limited by mechanical constraints, primarily relating to warping and breakage due to the required metal layer, such as an aluminum back layer. The thickness was also limited by a reduction in efficiency as the cell was made thinner due to increased recombination losses (loss of photogenerated charge carriers in the silicon) at the back surface. Thus heretofore the minimum practical wafer thickness was on the order of about 280 to 300 microns. By employing an EWT design, with all its inherent advantages, the inventor has unexpectedly discovered that the thickness of the wafer can be substantially and significantly reduced, without the mechanical and practical problems encountered in the prior art. It has further been unexpectedly and surprisingly discovered that significant and substantial advantages result from the use of such thinner crystalline wafer, including without limitation increased electrical efficiency of the device as thickness is reduced and substantial advantages in usable materials and manufacturing processes.

As used throughout the specification and claims, emitter wrap-through or EWT cell means a solar cell having a doped current collector layer on the front surface of a substrate with no metal on the front surface, a doped current collector layer on a portion of the back surface, and conductive means, or vias, extending through the substrate that connect the current collector layers on the front and back surfaces. The vias may comprise holes and may be created by laser drilling or etching holes and preferably doping the hole surface. The vias may alternatively be solid doped channels, preferably formed by a gradient-driven process, including but not limited to thermomigration and electromigration of a solvent through the substrate. The vias may optionally comprise metal or be at least partially metallized. The substrate preferably comprises a crystalline silicon wafer, and may be single crystal or multicrystalline, with or without a preferred orientation. Although as used herein EWT cell refers primarily to $n^+$ emitter layers on the surfaces of a p-type substrate, the term EWT cell may comprise any other configuration and is not limited thereto.

As used throughout the specification and claims, base contact region means an area adjacent to, or optionally comprising, the back surface of the substrate comprising a material that allows an electrical contact to be made to the substrate. The base contact region may optionally include a local back surface field, or BSF, preferably comprising a heavily doped layer. As a non-limiting example, for p-type substrates, the area would be $p^+$. The base contact region connects to a metal grid or finger which carries the current.

The EWT cell structure has been previously described in, for example, U.S. Pat. No. 6,468,652. It is well understood that this solar cell design has certain advantages in performance and in the ease of interconnection of the cells. This invention extends those advantages, and applies the EWT type of cell structure to thin crystalline wafers, thereby offering improvements in the process used to fabricate the cells on these wafers. U.S. Pat. No. 6,468,652 discloses several versions of EWT cells, and several methods of making. Each of the process sequences and variations thereof disclosed in U.S. Pat. No. 6,468,652 may be employed in this invention, substituting a thin silicon wafer as disclosed herein. Similarly, each of the versions of EWT cells disclosed in U.S. Pat. No. 6,468,652 may be made employing the thin silicon wafer of this invention. It is to be understood that n-type silicon substrates can be substituted for p-type substrates with corresponding reversals in the conductivity types of the various regions in the cell, as disclosed therein.

The present invention solves several problems with the current art. First, in a standard solar cell design the cost of the silicon raw material is a significant portion of the total cost. This is a major issue because the photovoltaic market is very cost sensitive, and because it is costly to manufacture high-purity silicon for semiconductor applications. However, with conventional solar cell design if the wafer thickness is reduced to below approximately 280 microns, then significant and substantial performance degradation results. Less light energy is converted to electrical energy because some of the light actually passes through the wafer and is not absorbed. More importantly, the back surface becomes a larger contributor to recombination losses in the solar cell as the cell is made thinner. To prevent this, a layer of aluminum is conventionally applied to the entirety of the back side of a solar cell and then alloyed into the silicon to form an Al doped, p-type layer. This doped layer, known as the back surface field or BSF, then prevents the loss of light and increases the electrical output of the solar cell. The problem with this solution is that the aluminum layer also causes mechanical and thermal stress in the wafer due to the difference in the thermal expansion coefficients of silicon and aluminum. As the wafer thickness is reduced, this induced stress causes bowing of the wafer and breakage. Thus, there is a need for a practical means for fabricating thin crystalline silicon solar cells that introduces little stress and that maintain high efficiencies.

Figure 1:
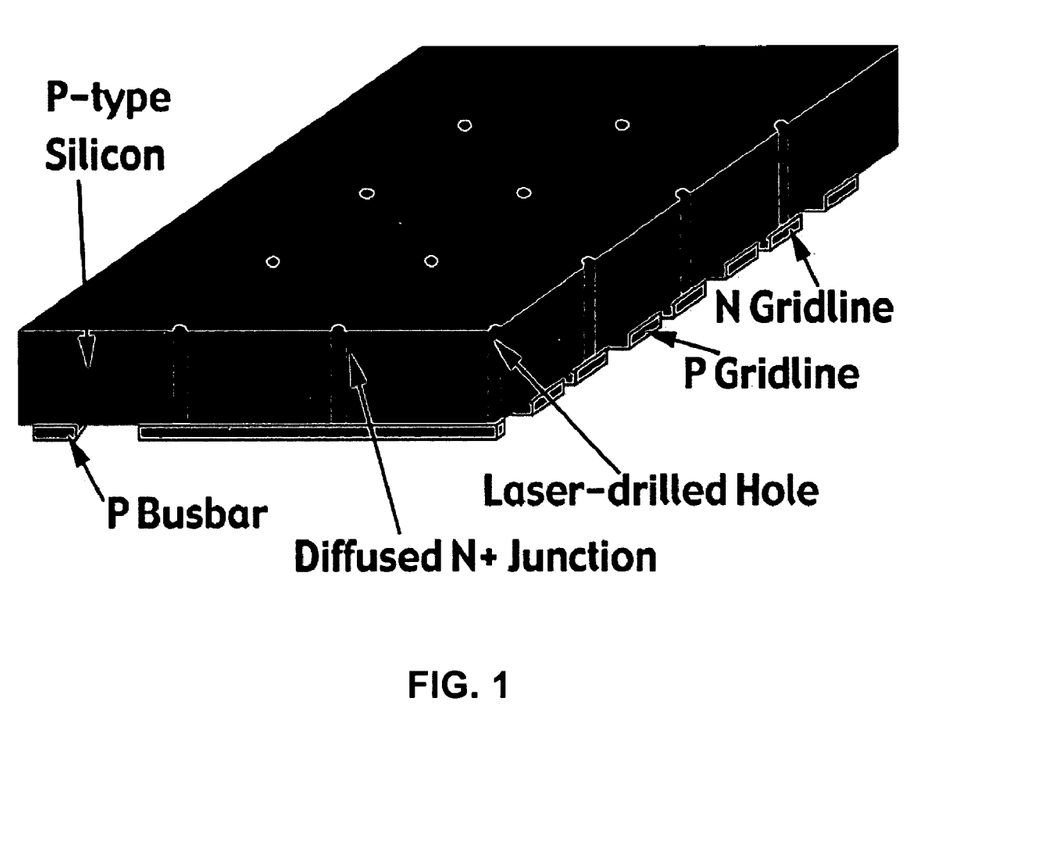
FIG. 1 is a schematic cross section of an EWT solar cell structure of the invention, depicted as fabricated on p-type silicon wafer with laser-drilled holes.

The EWT cell shown in FIG. 1 can be fabricated on p-type or n-type silicon wafers. If, for example, p-type silicon is used, then a heavily doped $n^+$ region is formed, by diffusion for example, on the front surface, in the holes, and on the $n^+$ regions of the back surface. The remaining back surface is p-type. The electrical contacts are then formed on these two regions on the back surface. With this design there is additional current collection at the p/n junction formed at the back between the p-type wafer and the $n^+$ regions. Thus the energy conversion efficiency for EWT cells is typically much higher than for conventional cells with an aluminum-alloyed back surface. Note that although FIG. 1 depicts vias which were made by laser drilling and doping, vias may be made according to other methods, such as etching. In an alternative embodiment of EWT cells, solid vias may be made using gradient driven methods, including but not limited to thermomigration and electromigration, as more fully described below.

The back surface of an EWT cell has an $n^+$ layer that enables back side carrier collection. Preferably, a majority of the back surface has an $n^+$ layer in order to maximize current collection from this layer. Thus, only a limited area of the back surface in an EWT cell comprises the base contact region; that is a p-type surface that requires passivation. In particular, a stress-inducing, full-area Al alloyed layer is not required. It is an advantage of the present invention that the base contact area is greatly reduced over those utilized in the prior art. There are a number of means for forming the patterned $n^+$ diffusion, passivating the p-type surface, and electrically isolating the negative- and positive-polarity contacts and current collection grids on the back surface. Some preferred methods are described in U.S. Pat. No. 5,468,652. Even if an Al alloy were used for forming the base contact region and/or grids; the area of the Al alloy may be greatly reduced (no more than about 25% and preferably less than 5%) and it would be disposed in a discontinuous pattern that would introduce less stress in the solar cell. This area reduction means that thermal stresses are reduced sufficiently so that inexpensive materials and processes for producing the p-type region can be utilized, while still eliminating bowing of even dramatically thinner wafers. In addition, many embodiments do not require an Al alloyed junction or require processes that otherwise introduce stress into thin silicon substrates.

There are other advantages besides the elimination of bowing to reducing the area of the base contact region. It is known that that the p-type surface must be well passivated in order to achieve maximum efficiency. This means that the metal contact and the passivation layers on the p-type surface must be of high quality and relatively free of defects, which is expensive to achieve. This is more important the larger the base contact region. By reducing this area, as in the case of EWT cells, the need for good quality passivation is lessened; by minimizing this area, the need for any passivation at all is greatly reduced, or even eliminated. This results in cost savings due to a reduction in process steps. Alternatively, materials may be chosen for other properties besides their passivation efficiency. For example, silver or other materials may be used for the contacts rather than alloyed aluminum. Silver has poor passivation properties and is typically unacceptable for use as a passivation layer. However, it has significantly higher reflectivity than aluminum, meaning that optical absorption in the cell is increased, which is very important for thin wafer cells, which have less bulk carrier generation than thick cells. In another example, the use of nickel in the base contact region is advantageous because of the ability to use low temperature processing and because it produces a very low contact resistance to both $p^+$ and $n^+$ silicon. Thus by reducing the need for efficient passivation, materials with other desirable properties can be used. Note that even if the layer is well passivated, efficiency is still gained by reducing its area and increasing the area of the $n^+$ region on the back surface, because of the resulting increase in carrier collector sites.

The amount of area reduction possible is dependent on the minimum feature size for the deposition process used. For example, there may be practical limits to the size reduction of the base contact region achievable when using screen printing. Thus it is desirable to use a method for forming local contacts to the p-type substrate that pass through an $n^+$ junction. In that case, nearly the entire back surface is covered with an $n^+$ junction, resulting in a significant increase in efficiency. The patterning is preferably formed by laser drilling or by screen printed resist and etching, and the base contact region and electrical isolation from the surrounding $n^+$ layer is preferably performed by forming a $p^+$ doped junction. The $p^+$ doped junction is preferably formed by aluminum alloying, by diffusion of a p-type acceptor, including but not limited to boron, from gaseous, printed, or spun-on sources, or by using a gradient driven process such as thermomigration or electromigration. One such process is described in D. W. K. Eikelboom et al., "Conductive Adhesives for Interconnection of Busbarless Emitter Wrap-Through Solar Cells on a Structured Metal Foil", presented at the 17th European Photovoltaic Solar Energy Conference, Munich, Germany, 22-26 Oct. 2001, p. 1547, which is incorporated by reference. EWT cells of the present invention preferably comprise a base contact region comprising less than 50%, more preferably less than 40%, even more preferably less than 25%, yet more preferably less than 10%, and most preferably less than 5% of the back surface area.

Because EWT cells have $n^+$ emitters on both the front and back surfaces of the cell which form p-n junctions with the bulk of the wafer, making the wafer thinner dramatically shortens the average distance that photogenerated carriers have to travel to be collected at either surface. This means that carrier collection with short diffusion lengths can be accomplished. Since the minority carrier diffusion length, or recombination lifetime, is an important limiting factor on the energy conversion efficiency of the cell, this means that inexpensive, lower quality wafers with short recombination lifetimes may be used. In existing cells this undesirably reduces the generated current, but in cells of the present invention current is not affected, because the carriers can be collected before recombination occurs. Similarly, it is preferable to use substrates heavily doped with, for example, a p-type acceptor, including but not limited to boron, which enables the cell to produce higher voltages than cells using typical substrates. However, this heavy doping significantly reduces the recombination lifetime, for example in one embodiment from about 30 microseconds to about 5 microseconds. This is acceptable for the thin wafer cells of the present invention, however, because of the corresponding decrease in time for a carrier to reach a collector junction.

For any silicon photovoltaic cell comprising thin wafers, the surface to volume ratio of the cell increases until, at some thickness, recombination at the surfaces dominates bulk recombination. For conventional silicon cells with an $n^+$ junction on the front surface and a p-type contact on the back surface, this means that it becomes more important to utilize an expensive, well passivated p-type contact to attempt to maintain efficiencies as the wafer is made thinner. In addition, the thinner the wafer, the less bulk there is to absorb incident light, lowering efficiency of the cell. These two effects compete with the shorter collection path of the thinner wafer. Eventually, the passivation becomes marginal and surface recombination and lack of bulk absorption win out; thus there is a peak in the efficiency vs. thickness curve. That is, as the thickness decreases, the efficiency increases until it reaches a maximum; then the efficiency decreases as thinner wafers are used. For conventional solar cells having electrical contacts on the front and back side, this peak typically occurs at a wafer thickness of greater than 300 microns (see, for example, Duerinckx et al., cited above, and C. J. J. Tool, et al., "Effect Of Wafer Thickness On The Performance Of Mc-Si Solar Cells", presented at the 17$^{th}$ European Photovoltaic Solar Energy Conference and Exhibition, Munich, Germany, 2001, p. 40). For typical p-type materials with average passivation, this figure is even higher.

Figure 2A:
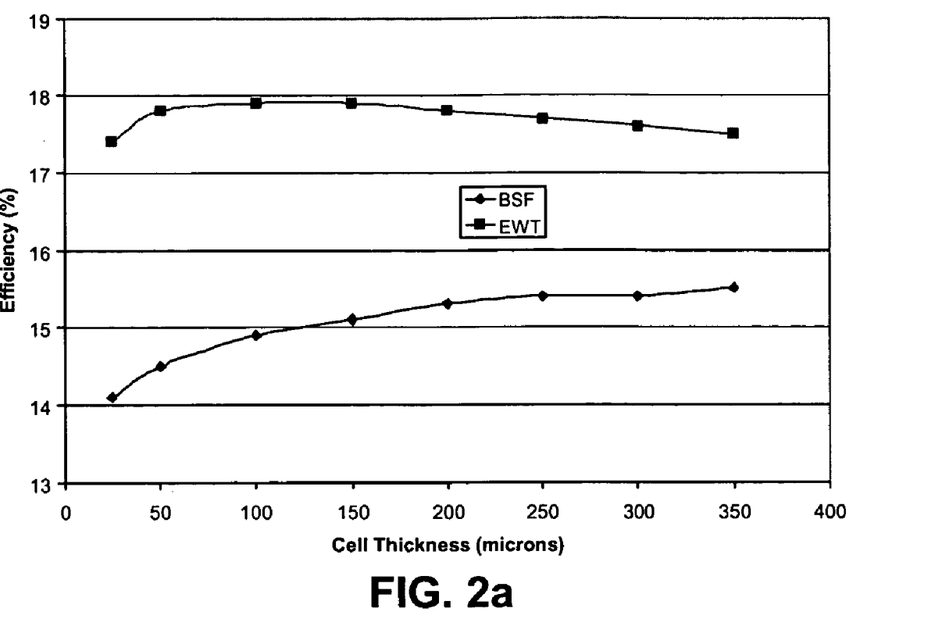
FIG. 2a is a graph depicting the efficiency vs. wafer thickness for both EWT and Al-passivated BSF solar cells comprising a standard quality substrate.
Figure 2B:
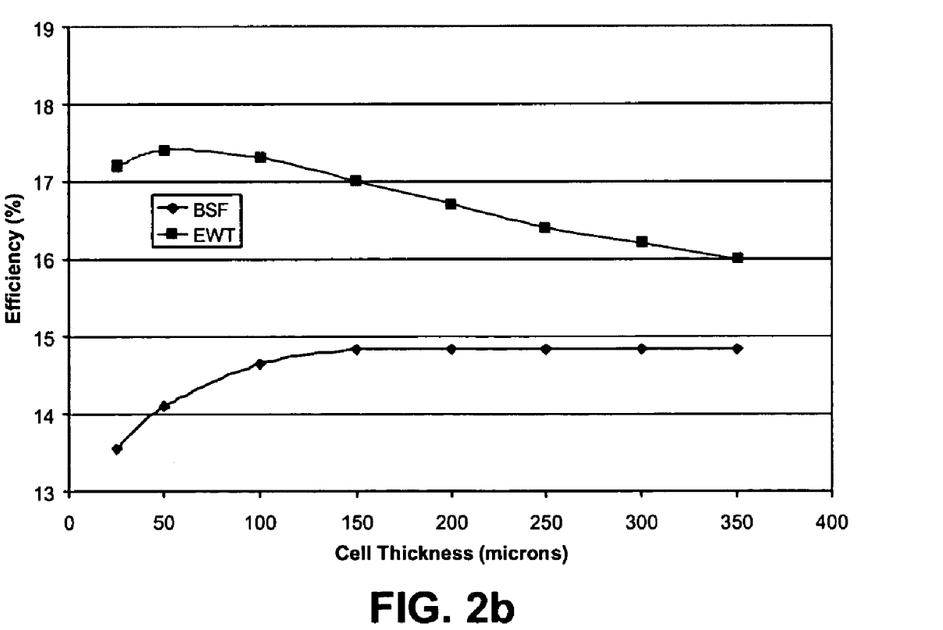
FIG. 2b is a graph depicting the efficiency vs. wafer thickness for both EWT and Al-passivated BSF solar cells comprising a low quality substrate.

For EWT cells, even though the overall efficiency is higher than that of standard solar cells, it was previously thought that the maximum efficiency would occur for roughly the same wafer thickness. However, it has unexpectedly been discovered that not only is the overall efficiency higher for EWT cells, but that the maximum efficiency for EWT cells occurs at a far lower wafer thickness than for ordinary cells. This is demonstrated by the theoretical calculations displayed in FIG. 2, which shows efficiency vs. thickness curves for an EWT cell and a BSF cell (i.e. a conventional solar cell with an aluminum alloyed passivation layer).

FIG. 2a shows calculated efficiencies for a bulk material with a resistivity around 1.2 ohm*cm and a 30 μs lifetime. The 30 μs lifetime corresponds to a diffusion length of around 288 μm. The diffusion length is the distance that an injected carrier moves in silicon before it is lost through recombination; it is therefore essentially equivalent to the collection length in the solar cell. These parameters are appropriate for today's preferred commercial multicrystalline-silicon material. Using this material, a typical value of the back-surface recombination velocity, which is a measure of how well passivated the aluminum alloy layer is, in existing BSF solar cells is about 3500 cm/s, as disclosed in Tool, et al., cited above. Using these numbers, the calculations in FIG. 2a show that the efficiency for the BSF cell has already peaked at somewhere greater than 350 μm, and the efficiency decreases as a thinner wafer is used. However, the efficiency for the EWT cell continues to rise until the wafer thickness is about 115 μm, an enormous advantage over the BSF cell.

FIG. 2b is similar but assumes the use of a substrate having a resistivity around 0.5 ohm*cm and a 5 μs lifetime, corresponding to a diffusion length of only around 108 μm. These parameters are appropriate for inexpensive solar-grade materials that are more heavily doped with boron and contaminated with metallic impurities. (Typically, low quality silicon materials generally have crystallographic defects and impurities that limit the diffusion length to less than about 300 μm, and even to less than about 200 μm. Also, because boron is one of the most common and difficult to refine impurities in silicon, it will likely be a large component in any inexpensive grade of silicon developed specifically for the solar industry.) The Al-alloyed junction is less effective with more heavily doped substrates since the step in doping density at the junction is reduced. The same Al alloyed junction that has a back-surface recombination velocity of 3500 cm/s in 1.2 ohm*cm silicon has a back-surface recombination velocity of 10,000 cm/s in 0.5 ohm*cm silicon. This latter value was used in the simulations for FIG. 2b. Note that the EWT efficiency rises dramatically as substrates decrease below 350 µm in thickness, and peaks for even thinner substrates (about 55 µm) than when good quality silicon is used. In contrast, there is still no increase in efficiency below 350 microns for the BSF cell. These unexpected results confirm that thin EWT cells are uniquely the best choice for obtaining high efficiencies, over 15% and even over 17%, from inexpensive poor quality or heavily doped substrates.

When considering diffusion lengths, because an EWT cell has $n^+$ emitters on both the front and back surface, it is desirable to choose a wafer thickness that is about half the wafer's diffusion length. However, due to the various constraints detailed above, there was no expectation that overall efficiency could be maintained by reducing the thickness to such a small value for use with low quality, low diffusion length substrates. It was not anticipated that the efficiency would actually increase as wafer thickness was decreased, even to less than half the diffusion length. Thus EWT cells' inherent carrier collection at both surfaces, as well as the strategies of preferably reducing the area of the base contact region (and thus reducing surface recombination and stress) and preferably using silver as a contact material (to increase optical absorption compensating for less absorption in the bulk as a thinner substrate is used) provide an unanticipated efficiency gains for the use of thin wafers over competing cell configurations, including EWT cells with base contact regions formed by expensive methods such as doping or lithography.

The front surface of the cell of the present invention is preferably textured, which reduces optical reflectance losses and, like using silver contacts, increases optical absorption in thin cells. Texturing of the preferred multicrystalline silicon wafer of the present invention can be accomplished by any means known in the art, including but not limited to acidic texture etching using a nitric:HF:acetic acid chemistry, dry etching techniques comprising reactive ion etching using $Cl_2$ or $SF_6$, mechanical texturing (e.g. with dicing blades), or $XeF_2$ anisotropic etching. Texturing of single-crystal silicon with a (100) surface orientation is easily accomplished with, for example, KOH or NaOH aqueous solutions, possibly with isopropyl alcohol, as is well known in the art.

Yet another advantage of the EWT structure on thin wafers is a reduced processing time and cost. The EWT cell requires numerous vias that run completely through the wafer connecting the front surface and the back surface. In one embodiment holes are created in the substrate, and a doped region is then created in these holes to provide the conductivity from the front surface to the electrical contacts on the back. One drawback with EWT cells is the processing time required to form these holes. They are preferably formed by laser, which is a relatively slow process. However, by reducing the wafer thickness from 300 microns or more to the thicknesses disclosed herein, such as less than about 200 microns, the energy required to form the holes is reduced proportionately. This reduces the processing time and therefore the manufacturing cost. It also causes less thermal stress in the wafer and results in higher surface quality in the holes themselves.

Other processes, not heretofore utilized in making photovoltaic cells, can also be used to form the conductive path, with or without holes, through the wafer, in large part because the wafer is so thin. Thus an advantage of a thinner wafer is that the range of methods that can be used to form the vias is widened. The present invention thus includes these additional processes and methods. Use of thick wafers, as employed in the prior art, limits options for making cells, but with thin wafers processes and methods are possible. Via holes may be produced using, for example but not limited to, mechanical drilling and water jet machining. Chemical (wet or dry) etching is also useable. Because fast etching processes are typically isotropic, the diameter of a via hole becomes approximately the same as the wafer thickness. For standard wafer thicknesses, the via holes would be too large. However, for thin wafers, the hole size is acceptable.

Another such process, one which does not require the creation of holes in the substrate and therefore results in a more mechanically stable cell, is thermomigration. U.S. patent application Ser. No. 10/606,487, entitled Fabrication Of Back-Contacted Silicon Solar Cells Using Thermomigration To Create Conductive Vias, filed on Jun. 26, 2003, on which the inventors herein are co-inventors, is incorporated by reference as if set forth here in full. Using the process of thermomigration, sheets, wires, or drops of a suitable metallic liquid can move through the bulk of a semiconductor material under the influence of a thermal gradient, leaving behind a trail comprising recrystallized solid host material doped with a solid solution of dopant material left behind by the passage of the liquid phase. Thermomigration can form conductive channels (vias) of heavily doped silicon if the liquid metal droplet contains (or is) a dopant having opposite polarity of the substrate. Thermomigration, also called temperature gradient or Thermal Gradient Zone Melting (TGZM), of fine droplets and planar zones has been shown to be a stable process when the dimensions of these zones are sufficiently small.

The TGZM process was first patented by Pfann in 1957. See also H. E. Cline and T. R. Anthony, Journal of Applied Physics, Vol. 47, No. 6, June 1976. Cline and Anthony have measured aluminum-rich liquid wires and dots/droplets migrating through n-type silicon at 1200° C. with an applied thermal gradient of about 50° C./cm at a velocity of about 1 mm/hour. In this experiment, the recrystallized silicon deposited behind the migrating aluminum-rich droplet was doped sufficiently high with a residual solid solution of aluminum (p-dopant) to convert the original n-type silicon matrix/host to p-type silicon inside of the recrystallized columnar/cylindrical droplet trail that was left behind.

Thermomigration has been used to fabricate p-n junctions in solar cells. See, for example, U.S. Pat. No. 3,936,319 to Anthony, et al.; U.S. Pat. No. 4,190,852 to Warner; and U.S. Pat. No. 4,173,496 to Chaing, et al. However, this technique has not been used to fabricate completely back-contacted solar cells, or to fabricate n-doped conductive vias in back-contacted solar cells.

For EWT cells, which require a conductive path through the wafer, thermomigration is an effective method for introducing the conductive path. Thermomigration may be accomplished, for example, by screen-printing "dots", ovals, lines or other patterns of metal on the front surface of the silicon wafer and then illuminating the wafer with a high-energy light such as that used in rapid thermal processing of wafers for other applications. The applied heat results in a thermal gradient across the thickness of the wafer that drives the metal through the thickness of the wafer to the back side. Thus, a conductive path is formed. The term "thermomigration"

includes any form of gradient-driven migration process, including processes conventionally known as thermomigration and electromigration. Because these processes allow vias to be formed in parallel, via formation may be faster than other methods such as laser drilling.

In a gradient-driven transport process, such as thermomigration (or electromigration), a gradient in temperature (or electric field) determines the direction for transporting/migrating the solvent material. In the fabrication of silicon solar cells, the direction of the thermal gradient is typically oriented across the thickness of the silicon substrate/wafer (i.e., in a direction perpendicular to the plane of the silicon substrate). Such a thermal gradient can be produced by heating one side of the substrate, rather than both sides (which would produce a uniform temperature).

The thermomigration metal used in p-type silicon must dope the silicon n-type (e.g., $n^{++}$) in order to form a conductive channel between the phosphorus diffusion layers on the front and rear surfaces. Examples of suitable n-type dopant metals include phosphorus, arsenic, and antimony, and combinations or alloys thereof. These dopant metals can be used either in their elemental form, or can be combined, alloyed, or mixed with a carrier metal that forms a eutectic phase with silicon at relatively low temperatures. Examples of suitable carrier metals include silver, platinum, gallium, magnesium, indium, aluminum, tin, copper, and gold, and combinations or alloys thereof (e.g., silver/aluminum, silver/tin). Alternatively, ternary alloys may be used. For example, silver-gold-antimony and silver-tin-antimony may be used to dope silicon n-type. Silver-aluminum-antimony may be used to dope silicon either n-type or p-type, depending on the TGZM process temperature and droplet composition. In general, however, the TGZM process is practiced at a temperature greater than the temperature at which intermetallic compounds are formed between the material of the semiconductor body and either the dopant material and/or carrier droplet material.

The present invention preferably uses a known embodiment of thermal migration which optionally requires that the solvent, but not the substrate, is melted. The liquid solvent (e.g., drop, droplet, wire) then diffuses through the solid substrate, or host, in the presence of a temperature gradient (i.e., thermal gradient). The physics of the process involves more-rapid dissolution of the solid host at the front (hotter) surface of the liquid drop, which causes a supersaturation of the solute (i.e., solid host dissolved in liquid solvent) at the rear (colder) surface of the liquid drop where it is deposited. In other words, liquid droplets (typically, metals) migrate inside a solid host in the direction of the thermal gradient from cold to hot because atoms of the solid host dissolve into the liquid at the hot interface of the droplet, diffuse across the droplet, and deposit on the cold interface of the droplet. The resulting flux of dissolved solid host atoms from the hot to the cold side of the liquid droplet causes the droplet to migrate in the opposite direction, namely towards the hot end of the host. For metallic droplets, the melting temperature of the semiconductor substrate must be above the semiconductor/metal eutectic temperature for thermomigration to work. Alternatively, interdiffusion of the solvent and the solid host occurs at a temperature lower than the melting points of either of the pure solvent or host. This preferably forms a solution with a lower melting point, and it is the solution that melts. In this case, the temperature is lower than the melting points of the pure materials, but high enough to melt the solution once a desired amount of the host is interdiffused into the solvent, thereby speeding up the reaction.

The steady-state velocity of thermomigration is proportional to the thermal gradient and to the average temperature (through the diffusivity and solubility of silicon in the metal solvent), and is not directly dependent upon the wafer thickness. Hence, the time to thermomigrate a conductive via is expected to decrease at least linearly with the thickness. However, when the thermomigration feature size is approximately the same size or larger than the device thickness, typical thermomigration kinetics break down. For example, local inhomogeneities where the metal-silicon reaction takes place much faster ("spiking") is well known in some metal-silicon systems, for example Al-Si. Such an inhomogeneous reaction may produce small areas of contact of the thermomigration metal with the opposite surface very rapidly, possibly due to pre-existing crystallographic defects or inhomogeneities in the surface. The spiking, along with a capillary action once the opposite surface is wetted, can greatly accelerate thermomigration. Since the depth of such inhomogeneous reactions is proportional to the amount of metal available, this effect only occurs when the feature size of the thermomigration metal is of the same order as the wafer thickness.

Electromigration is another type of gradient-driven migration process, similar to thermomigration that can be used to move metal droplets through a semiconductor material. For more details, see U.S. Pat. No. 4,377,423 to Anthony, which is incorporated herein by reference. In this process, an electric field gradient (potential) provides the driving force for moving liquid metal droplets through the thickness of a semiconductor material, such as liquid aluminum drops through silicon.

The metal droplet, line or other structure preferably thermomigrates completely through the thin semiconductor material and re-emerges on the opposing side. The re-emerged droplet or other structure can be removed, e.g., by mechanical polishing. Alternatively, re-emerged droplet or other structure can be left in place and not removed, where it can form part or all of a back side contact.

Another advantage of thermomigrated or other gradient-driven vias is lower series resistance than vias comprising holes. A thermomigrated conductive via provides lower series resistance compared to diffused holes in the EWT cell because it is a solid cylinder or other solid structure that is doped, while the EWT cell only has a thin surface $n^+$ diffusion in the walls of the laser-drilled holes. If the thermomigration metal is left in place after thermomigration, it yields a much lower contact resistance, as well. Further, if the thermomigrated via is a pattern of lines rather than holes, losses due to current flow in the emitter is reduced. Also, if the thermomigrated via pattern is a pattern of lines, the thermomigration metal on the back surface may be left on the surface and used as the n-type grid. This effect magnifies the lower series resistance of vias, formed by any method, which are shorter when thinner wafers are used. This means at maximum power the attainable voltage is increase, a significant advantage over EWT cells having a standard wafer thickness.

EWT cell technology has never been applied to or implemented on thin crystalline silicon wafers. It may thus be seen that precise manufacturing processes will necessarily to be tailored to thin wafers. There are several options for the sequence of process steps, and also choices as to the exact process for some steps. For example, because all the metallization is on only the back side of the cell, stresses due to screen printing during the manufacturing process are greatly reduced.

In a preferred embodiment, there is a diffusion barrier, preferably comprising a doped dielectric paste comprising a p-type acceptor, including but not limited to boron, aluminum, or indium, applied to the back of the solar cell in any desired pattern prior to the phosphorous diffusion step. This barrier, which is designed to block phosphorous diffusion, can be spun on, screen printed, or sprayed. When phosphorous is diffused into the substrate to create an n+ doped region, the p-type acceptor in the dielectric preferably diffuses into the substrate at the same time, creating a p-type region while saving a processing step. This method is particularly adaptable to the use of thin silicon wafers and provides an inexpensive means for manufacturing small base contact regions. Alternatively, as previously discussed, small p+ contacts can be made through the n+ emitter on the back surface.

To obtain the desired thickness, the silicon wafer may be cut in appropriate thicknesses, about 300 microns, preferably about 200 microns, more preferably about 100 microns, even more preferably about 60 microns, and most preferably about 20 microns, by any means known in the art. In one embodiment, conventional sawing methods are employed. However, other methods may also be employed.

Although the invention has been described in detail with particular reference to these preferred embodiments, other embodiments can achieve the same results. Variations and modifications of the present invention will be obvious to those skilled in the art and it is intended to cover all such modifications and equivalents. The entire disclosures of all references, applications, patents, and publications cited above, and of the corresponding applications, are hereby incorporated by reference.

What is claimed is:

1. An emitter wrap-through (EWT) solar cell comprising a silicon wafer substrate having a thickness and comprising a diffusion length of less than 145 microns;
   wherein said thickness is less than approximately half of a diffusion length of said substrate;
   wherein said solar cell comprises a back surface recombination velocity of greater than 100 cm/s; and
   wherein said substrate is multicrystalline or has a crystal orientation other than (110).

2. The solar cell of claim 1 wherein said substrate has a thickness of less than approximately 60 microns.

3. The solar cell of claim 2 wherein said substrate has a thickness of less than approximately 20 microns.

4. The solar cell of claim 1 further comprising at least one base contact region disposed on a back surface of said cell.

5. The solar cell of claim 4 wherein said base contact region comprises less than approximately 50% of a surface area of said back surface.

6. The solar cell of claim 5 wherein said base contact region comprises less than approximately 25% of said surface area.

7. The solar cell of claim 6 wherein said base contact region comprises less than approximately 5% of said surface area.

8. The solar cell of claim 4 wherein said base contact region provides little or no passivation.

9. The solar cell of claim 4 wherein said base contact region comprises a higher optical reflectance than aluminum.

10. The solar cell of claim 9 wherein said base contact region increases the optical absorption of the substrate.

11. The solar cell of claim 1 comprising an efficiency of greater than about 15%.

12. The solar cell of claim 4 wherein said base contact region is formed by diffusion of a p-type acceptor from a diffusion barrier into the substrate.

13. A solar cell comprising a semiconductor wafer substrate having a thickness of;
   wherein the substrate has a diffusion length of less than approximately 145 microns;
   wherein said thickness is less than approximately half of said diffusion length;
   wherein the solar ceil comprises a back surface recombination velocity of greater than 100 cm/s; and
   wherein the solar cell has an efficiency of greater than approximately 15%.

14. The solar cell of claim 13 wherein said cell has an efficiency of greater than approximately 17%.

15. A method for making a solar cell, the method comprising the steps of:
   providing a p-doped multicrystalline silicon substrate having a thickness of and comprising a diffusion length of less than 145 microns, the substrate having a thickness of less than approximately half the diffusion length of the substrate;
   disposing an n+ emitter layer on a majority of a front surface and back surface of the substrate;
   connecting the n+ emitter layer on the front surface to the n+ emitter layer on the back surface; and
   disposing one or more base contact regions on portions of the back surface;
   wherein the solar cell comprises a back surface recombination velocity of greater than 100 cm/s.

16. The method of claim 15 wherein the substrate has a thickness of less than approximately 60 microns.

17. The method of claim 15 wherein the base contact regions comprise less than approximately 40% of the surface area.

18. The method of claim 17 wherein the base contact regions comprise less than approximately 10% of the surface area.

19. The method of claim 15 wherein the step of disposing one or more base contact regions comprises passing the base contact regions through the n+ emitter layer disposed on the back surface.

20. The method of claim 19 wherein passing the base contact regions through the n+ emitter layer comprises a process selected from the group consisting of laser drilling, etching, aluminum alloying, boron diffusion, thermomigration, electromigration, and/or a gradient-driven process.

21. The method of claim 15 wherein the solar cell has an efficiency of greater than about 15%.

22. The method of claim 15 wherein the step of disposing one or more base contact regions comprises the steps of:
   depositing a diffusion barrier that contains a p-type acceptor on desired areas of the back surface;
   diffusing the p-type acceptor contained in the diffusion barrier into the substrate.

23. A solar cell made according to the process of claim 15.

24. The solar cell of claim 1 wherein said substrate comprises p-doped silicon.

25. The solar cell of claim 5 wherein said base contact region comprises less than approximately 40% of said surface area.

26. The solar cell of claim 6 wherein said base contact region comprises less than approximately 10% of said surface area.

27. The solar cell of claim 10 wherein said base contact region comprises silver.

28. The solar cell of claim 4 wherein said base contact region comprises nickel.

29. The solar cell of claim 4 wherein said base contact region comprises a p* layer that passes through an n* emitter region disposed on said back surface in order to contact said substrate.

30. The solar cell of claim 1 wherein said substrate comprises a diffusion length of less than approximately 108 microns.

31. The solar cell of claim 1 wherein said substrate is doped with a p-type acceptor.

32. The solar cell of claim 31 wherein said p-type acceptor comprises boron.

33. The solar cell of claim 11 comprising an efficiency of greater than about 17%.

34. The solar cell of claim 1 wherein said substrate has a textured front surface.

35. The solar cell of claim 1 comprising vias connecting a front surface of said substrate to a back surface of said substrate.

36. The solar cell of claim 35 wherein said vias are formed by a process comprising an operation selected from the group consisting of laser drilling, dry etching, wet etching, mechanical drilling, and water jet machining.

37. The solar cell of claim 12 wherein said p-type acceptor comprises boron.

38. The solar cell of claim 12 wherein said diffusion barrier comprises a dielectric material applied as a paste.

39. The solar cell of claim 12 wherein said diffusion barrier comprises a dielectric material deposited by chemical vapor deposition and subsequent patterning.

40. The solar cell of claim 13 wherein said cell comprises an EWT cell.

41. The method of claim 16 wherein the substrate has a thickness of less than approximately 20 microns.

42. The method of claim 18 wherein the base contact regions comprise less than approximately 5% of the surface area.

43. The method of claim 15 wherein the step of disposing one or more base contact regions comprises increasing optical absorption of the substrate.

44. The method of claim 43 wherein the base contact regions comprise silver.

45. The method of claim 15 wherein the base contact regions comprise nickel.

46. The method of claim 15 wherein the substrate comprises a diffusion length of less than approximately 108 microns.

47. The method of claim 15 wherein the substrate is doped with a p-type acceptor.

48. The method of claim 47 wherein the p-type acceptor comprises boron.

49. The method of claim 21 wherein the solar cell has an efficiency of greater than about 17%.

50. The method of claim 15 further comprising the step of texturing the front surface.

51. The method of claim 15 wherein the connecting step comprises extending one or more vias through the substrate.

52. The method of claim 51 wherein extending one or more vias comprises using a process selected from the group consisting of laser drilling, dry etching, wet etching, mechanical drilling, and water jet machining.

53. The method of claim 22 wherein the p-type acceptor comprises boron.

* * * * *

UNITED STATES PATENT AND TRADEMARK OFFICE
CERTIFICATE OF CORRECTION

PATENT NO. : 7,649,141 B2  Page 1 of 1
APPLICATION NO. : 10/880190
DATED : January 19, 2010
INVENTOR(S) : Schmit et al.

It is certified that error appears in the above-identified patent and that said Letters Patent is hereby corrected as shown below:

Column 16, Claim 29, Line 62, delete "p*" and insert --$p^+$-- therefor;

Column 16, Claim 29, Line 62, "n*" and insert --$n^+$-- therefor.

Signed and Sealed this

Thirtieth Day of March, 2010

David J. Kappos
*Director of the United States Patent and Trademark Office*